United States Patent [19]
Jeong

[11] Patent Number: 6,081,472
[45] Date of Patent: Jun. 27, 2000

[54] CELL REFRESH CIRCUIT OF MEMORY DEVICE

[75] Inventor: Hong-Seok Jeong, Choongcheongbuk-Do, Rep. of Korea

[73] Assignee: LG Semicon Co., Ltd., Cheongju, Rep. of Korea

[21] Appl. No.: 09/023,282

[22] Filed: Feb. 13, 1998

[30] Foreign Application Priority Data

Feb. 18, 1997 [KR] Rep. of Korea .......................... 97-4897

[51] Int. Cl.$^7$ ....................................................... G11C 7/00
[52] U.S. Cl. .......................... 365/222; 365/226; 365/236; 365/233
[58] Field of Search .................................... 365/222, 226, 365/236, 233

[56] References Cited

U.S. PATENT DOCUMENTS

| | | | |
|---|---|---|---|
| 5,430,877 | 7/1995 | Naylor | 395/700 |
| 5,499,213 | 3/1996 | Niimi et al. | 365/222 |
| 5,867,438 | 2/1999 | Nomura et al. | 365/222 |
| 5,875,143 | 2/1999 | Ben-Zvi | 365/222 |

*Primary Examiner*—David Nelms
*Assistant Examiner*—Tuan T. Nguyen
*Attorney, Agent, or Firm*—Fleshner & Kim, LLP

[57] ABSTRACT

A cell refresh circuit of a memory device is provided that prevents deterioration in EPROM programmed data. The cell refresh circuit compensates for the loss of programmed data by reprogramming the programmed data in the EPROM after a predetermined time. The cell refresh circuit can be used with a memory device that includes a memory block that stores an executable program, data or the like and a sense amplifier that inputs and outputs data with respect to the memory block. The cell refresh circuit includes a power input unit applies a program voltage to the memory block when a program mode signal is enabled in a program mode, a source voltage to the memory block in normal operations and a pumping voltage to the memory block when a reprogram mode signal is enabled. Read/write controllers respectively applies a ROM read enable signal and ROM write enable signal to the sense amplifier. An address selector selects an externally applied address in a user mode and an internally generated address during a clock signal in a reprogramming mode and outputs the selected address to the memory block. A clock signal supply unit outputs a clock signal to the address selector based on a user mode signal, and a count controller determines the predetermined time and outputs the count enable signal to the address selector based on the user mode signal.

20 Claims, 5 Drawing Sheets

FIG.5A  CLK

FIG.5B  Address

FIG.5C  Data

FIG.5D  Vs

FIG.5E  WEPRM

FIG.5F  RRD

FIG. 6A CLK

FIG. 6B Address

FIG. 6C Data

FIG. 6F /CAo

FIG. 6G CAo

CELL REFRESH CIRCUIT OF MEMORY DEVICE

BACKGROUND OF THE INVENTION

1. Field of the Invention

Figure 1:
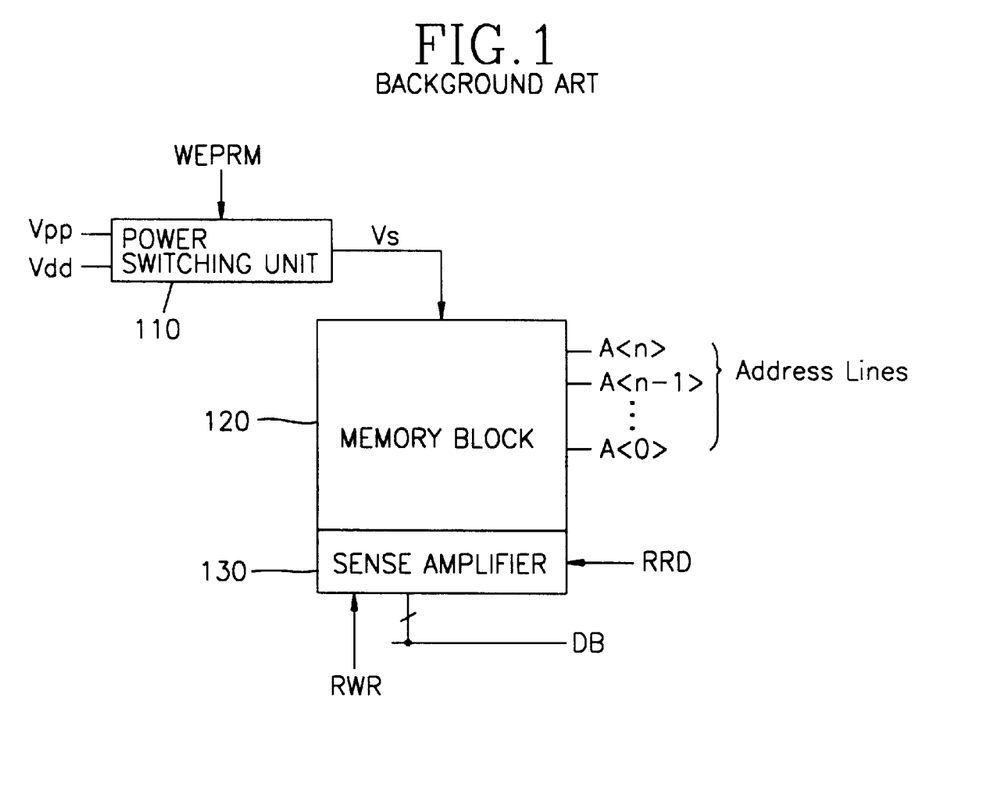
FIG. 1 is a block diagram showing a related art EPROM.

The present invention relates to a memory device, and more particularly, to a cell refresh circuit for a semiconductor memory device 2. Background of the Related Art FIG. 1 is a block diagram showing the construction of a related art erasable programming read only memory (EPROM). As shown in FIG. 1, a related art EPROM includes a memory block 120 for storing an executable program, a power switching unit 110 and a sense amplifier 130. The power switching unit 110 selects and outputs to the memory block 120 a program voltage (Vpp) in a program mode or a source voltage (Vdd) in a normal operation mode in accordance with a program mode signal (WEPRM). The sense amplifier 130 outputs data on a data bus (DB) to the memory block 120 when a ROM write signal (RWR) is enabled in a program mode or transmits the data stored in the memory block 120 to the data bus (DB) when a ROM read signal (RRD) is enabled in a normal operation mode.

When the EPROM is disposed in a ROM writer and the program mode signal (WEPRM) is enabled, the power switching unit 110 selects the program voltage (Vpp) and applies it to the memory block 120. Then, when the ROM write signal (RWR) is enabled and addresses (A0, ..., An) are accessed in the memory block 120, the sense amplifier 130 transmits a program carried on the data bus (DB) to the memory block 120 to store in a corresponding region. The operation for storing a program is repeatedly carried out to store the program in a corresponding region as addresses (A0, ..., An), which are sequentially accessed in the memory block 120.

When the storage of the program in the EPROM is completed and the EPROM is disposed to operate a system, the program mode signal (WEPRM) is disabled and the power switching unit 110 selects the source voltage (Vdd) to apply to the memory block 120. When the ROM read signal (RRD) is enabled and the addresses (A0, ..., An) are accessed in the memory block 120, the sense amplifier 130 reads out the data from the memory block 120 to transmit to the data bus (DB). Accordingly, a central processing unit (CPU can read a program carried on the data bus (DB) to execute a corresponding operation.

The related art EPROM, however, has various disadvantages. In the related art EPROM, the data programmed in the EPROM cell may be damaged with the lapse of time according to the characteristics of the EPROM cell. The damaged data in the EPROM cell can result in an unprogrammed state. Therefore, the reliability of the EPROM and operations of the system using EPROM cannot be ensured.

SUMMARY OF THE INVENTION

An object of the present invention is to that substantially obviate at least the problems and disadvantages of the related art.

Another object of the present invention is to compensate for the loss of the programmed data.

A further object of the present invention is to provide a cell refresh circuit that reprograms data in an EPROM upon a predetermined time lapse.

To achieve at least the above objects in a whole or in parts, there is provided a cell refresh circuit of a memory device that includes a memory block for storing an executable program, a sense amplifier for carrying out input and output of data with respect to the memory block, a power input unit for applying a program voltage to the memory block when a program mode signal is enabled in a program mode, applying a source voltage to the memory block in an operation mode and applying a pumping voltage to the memory voltage when a reprogram mode signal is enabled, read/write controllers for respectively applying a ROM read enable signal and a ROM write enable signal to the sense amplifier, an address selector for selecting an address in the memory block in a user mode, selecting an address in the memory block during a clock signal counting in a reprogramming mode based on a count enable signal and outputting each address to the memory block, a clock signal supply unit for outputting a clock signal to the address selector based on a user mode signal and a count controller for performing a counting for a predetermined time and outputting a count enable signal to the address selector in accordance with the user mode signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like numerals refer to like elements wherein.

DETAILED DESCRIPTION OF PREFERRED EMBODIMENTS

Figure 2:
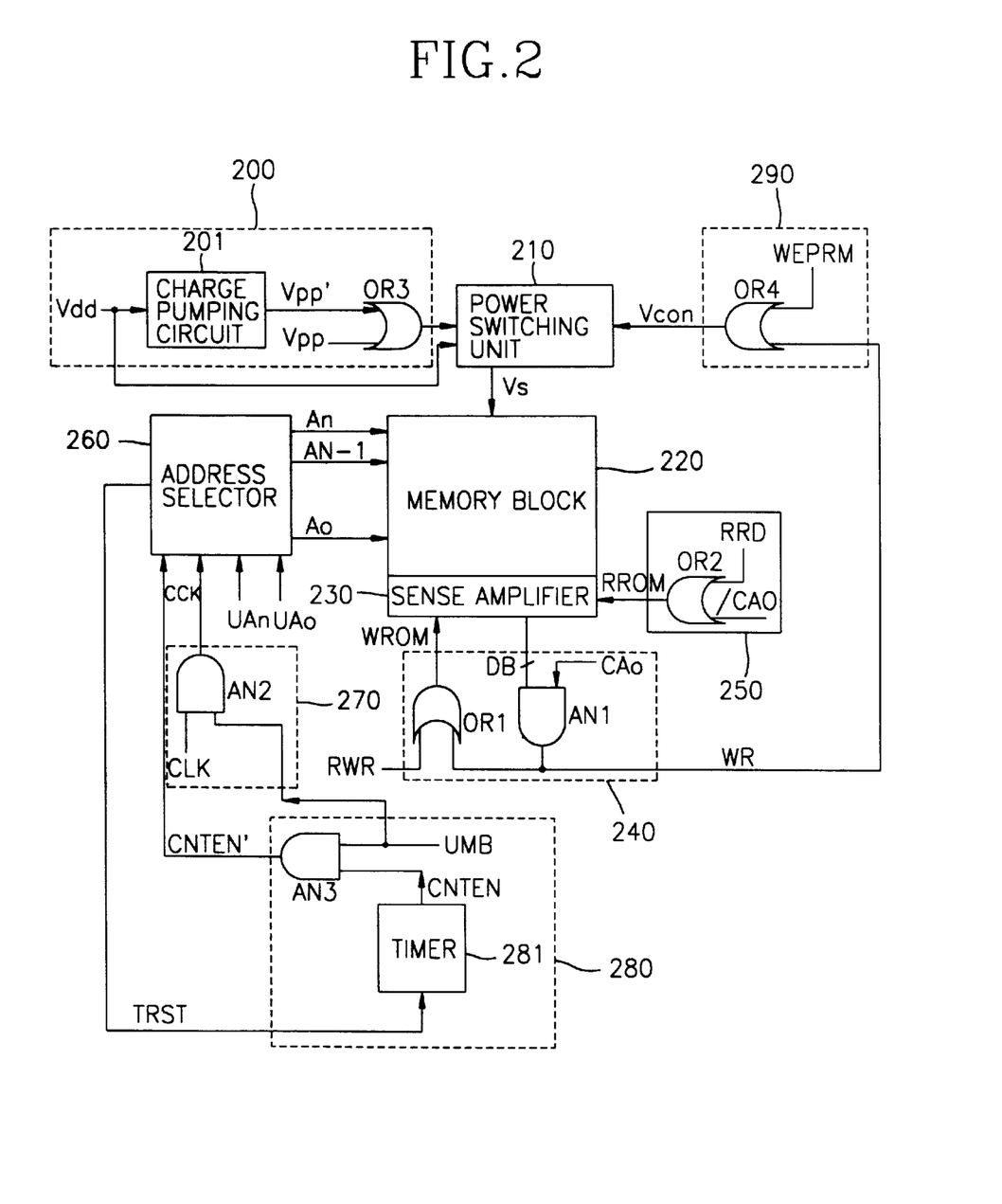
FIG. 2 is a block diagram showing a preferred embodiment of a cell refresh circuit according to the sent invention.

FIG. 2 shows a preferred embodiment of a cell refresh circuit for a memory device according to the present invention. As shown in FIG. 2, a memory block 220 stores information, such as an executable program, data or the like. A sense amplifier 230 inputs and outputs data with respect to the memory block 220. The cell refresh circuit includes a power supply unit 200 that can apply at least a source voltage (Vdd), a pumping voltage (Vpp') and a program voltage (Vpp). A power switching unit 210 applies the program voltage (Vpp) to the memory block 220 when a power selecting control signal (Vcon) is enabled in a program mode. The power switching unit 210 further applies a source voltage (Vdd) to the memory block 220 in an operation mode and applies the pumping voltage (Vpp') to the memory block 220 when a reprogram mode is set and a power selecting control signal (Vcon) is enabled.

A power selecting controller 290 outputs the power selecting control signal (Vcon) to the power switching unit 210 when the program mode signal WEPRM enabled in the program mode. The power selecting controller 290 can further output the power selecting control signal (Vcon) when a write signal (WR) is enabled in a normal operation mode. The power selecting controller 290 includes an OR gate (OR4) for ORing the program mode signal (WEPRM) and the write signal (WR) from the write controller 240 to output the power selecting control signal (Vcon).

An address selector 260 selects CPU-addressed addresses (UA0, ..., UAn) in a user mode. The address selector 260 selecting addresses (CA0, ..., CAn) during a clock signal (CLK) counting in a reprogramming mode based on a count enable signal (CNTEN') and outputs each selected address to the memory block 220. A clock signal supply unit 270 outputs a counter clock signal (CCK) to the address selector 260 in accordance with a mode signal (UMB). A count controller 280 outputs the count enable signal (CNTEN') to the address selector 260 by performing a counting for a predetermined time when the user mode signal (UMB) is enabled.

A write controller 240 outputs a ROM write signal (RWR) or the write signal (WR) as a ROM write enable signal (WROM) by logically processing (e.g., ORing and ANDing) the input and output of data, respectively, by the sense amplifier 230 in the operation mode. The write controller 240 can include an AND gate (AN1) for ANDing the output data DB from the sense amplifier 230 and the address (CA0) from the address selector 260 to output the write signal (WR), and an OR gate (OR1) for ORing the ROM write signal (RWR) and the write signal (WR) from the AND gate (AN1) to output the ROM write enable signal (WROM).

A read controller 250 outputs ROM read enable signal (RROM) to the sense amplifier 230. The read controller 250 includes an OR gate (OR2) for ORing the ROM read signal (RRD) and an inverted version (/CA0) of the address (CA0) from the address selector 260 to output the ROM read enable signal (RROM).

The power supply unit 200 includes an OR gate (OR3) and a charge pumping circuit 201 for generating a pumping voltage (Vpp') by pumping a source voltage (Vdd). The OR gate (OR3) outputs the program voltage (Vpp) or an output voltage (Vpp') from the charge pumping circuit 201 to the power switching unit 210. The power supply unit 200 also outputs the source voltage to the power switching unit 210.

The clock signal supply unit 270 includes an AND gate (AN2) for ANDing a clock signal (CLK) and the user mode signal (UMB) to output the counter clock signal (CCK). Thus, the counter clock signal (CCK) has the same cycle as the clock signal (CLK) to the address selector 260 when the user mode signal (UMB) is enabled.

The count controller 280 includes a timer 281 for generating a count signal (CNTEN). The timer 281 can perform counting for a predetermined time and is cleared by a reset signal (TRST) from the address selector 260. An AND gate (AN3) ANDs the user mode signal (UMB) and the output signal (CNTEN) from the timer 281 to output the count enable signal (CNTEN') to the address selector 260. Thus, preferably the count enable signal (CNTEN') can be enabled for the predetermined time.

Figure 3:
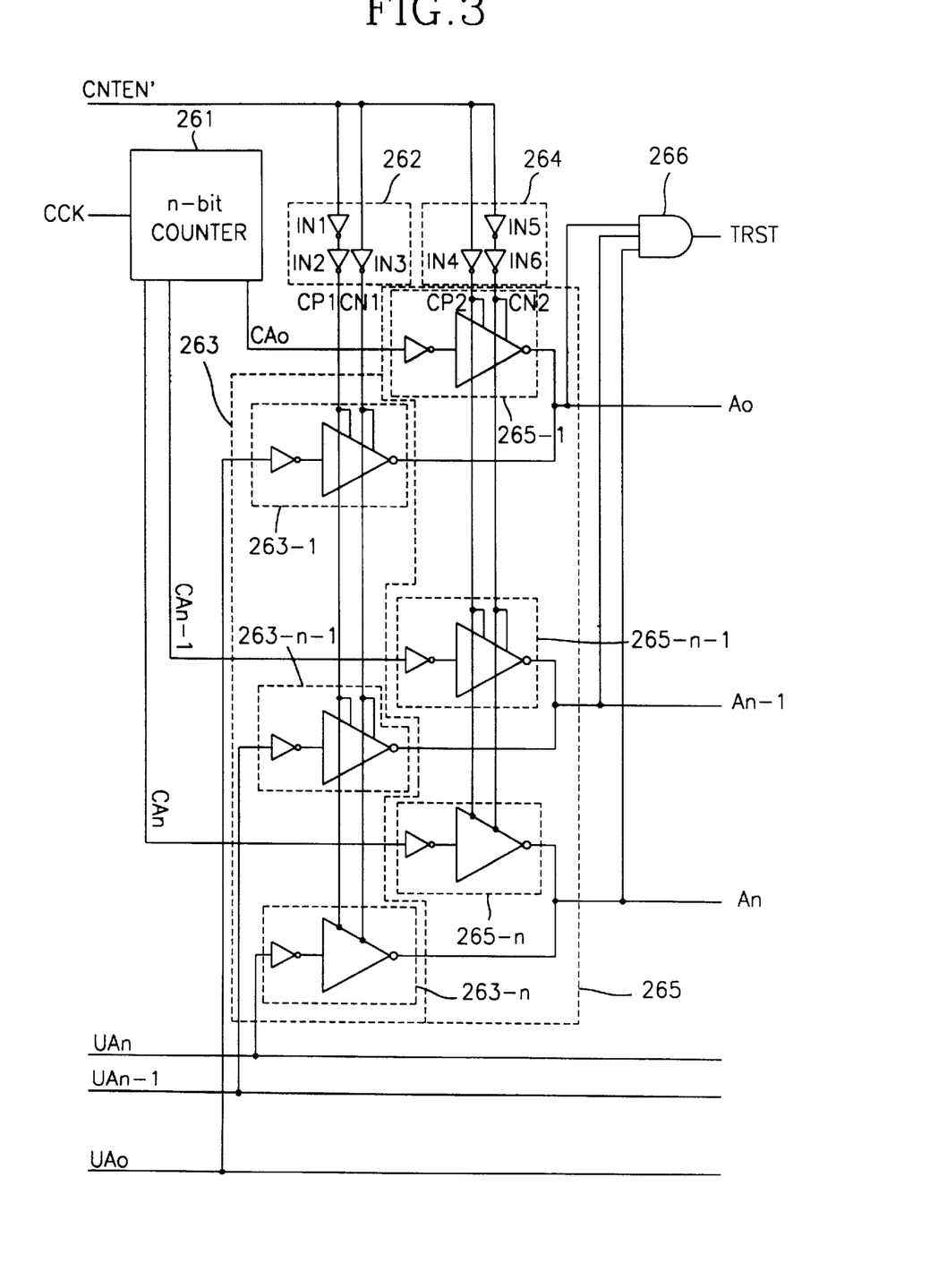
FIG. 3 is a circuit diagram showing an address selector of FIG. 2.

As shown in FIG. 3, the address selector 260 includes an n-bit counter 261 for counting the counter clock signal (CCK) to output addresses (CA0, ..., CAn). A first address selecting unit 263 selects externally input addresses (UA0, ..., UAn) and outputs them to the memory block 220 as addresses (A0, ..., An). A second address selecting unit 265 selects the addresses (CA0, ..., CAn) from the n-bit counter 261 to output to the memory block 220 as addresses (A0, ..., An). First and second address selecting control units 262,264 respectively control operations of the first and second address selecting units 263,265 by receiving the count enable signal (CNTEN') from the count controller 280. An AND gate 266 ANDs the addresses (A0, ..., An) to output the reset signal (TRST) to the count controller 280.

The first address selecting control unit 262 includes three inverters. First and second inverters (IN1,IN2) are coupled in series to sequentially invert the count enable signal (CNTEN') and output a control signal (CP1) to the first address selecting unit 263. A third inverter (IN3) inverts the count enable signal (CNTEN') to output a control signal (CN1) to the first address selecting unit 263.

The first address selecting unit 263 includes a plurality of address selecting circuits 263-1~263-n coupled in parallel. Each of the plurality of address selecting circuits 263-1~263-n includes an inverter for inverting a respective externally inputted address (QAo, ..., UAn) series coupled to a clocked inverter. The clocked inverters invert an output signal from the inverter in accordance with the control signals (CP1,CN1) outputted from the address selecting control unit 262 to transmit the respective addresses (A0, ..., An) to the memory block 220.

The second address selecting count enable unit 264 includes three inverters. A inverter (IN4) inverts the signal (CNTEN') to output a control signal (CP2) to the second address selecting unit 265. Inverters (IN5,IN6) are coupled in series to sequentially invert the count enable signal (CNTEN') and output a control signal (CN2) to the second address selecting unit 265.

The second address selecting unit 265 includes address selecting circuits 265-1~265-n coupled in parallel. Each of the plurality of address selecting circuits 265-1~265-n includes an inverter for inverting a respective address (CA0, ..., CAn), which are received from the address selecting unit 260, coupled in series to a clocked inverter. The clocked inverters invert the output signals from the inverters in accordance with the control signals (CP2,CN2) outputted from the second address selecting control unit 264 to transmit the respective addresses (A0, ..., An) to the memory block 220.

Figures 4, 5A:
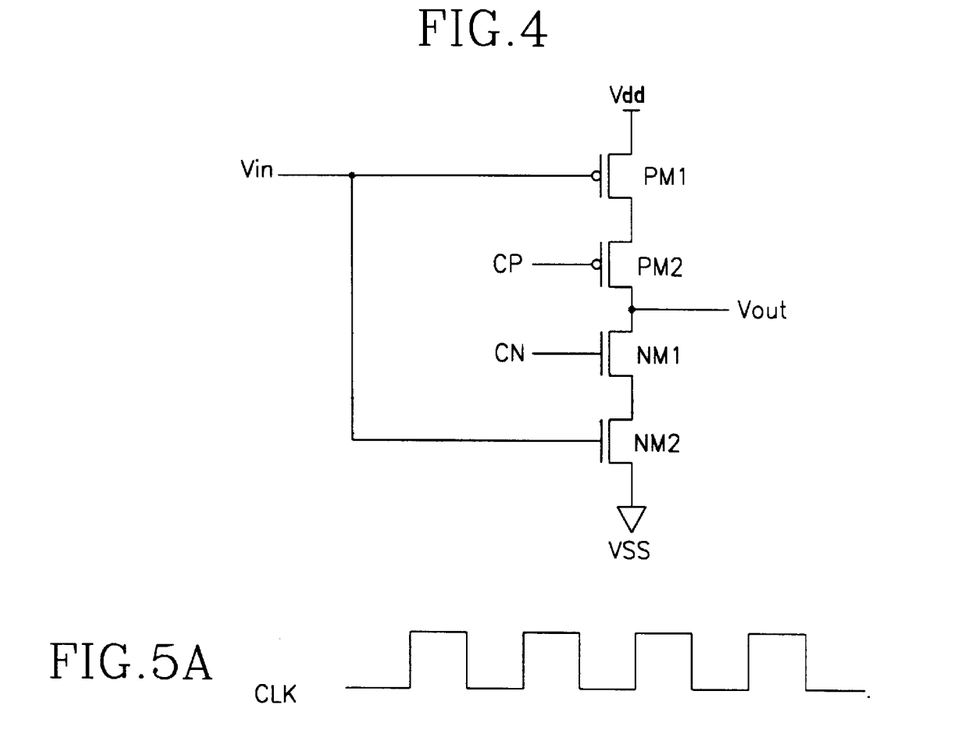
FIG. 4 is a circuit diagram showing a clocked inverter of FIG. 2.
FIGS. 5A–5F are timing diagrams of the cell refresh circuit of FIG. 2 in a program mode.
Figures 5B, 5C:
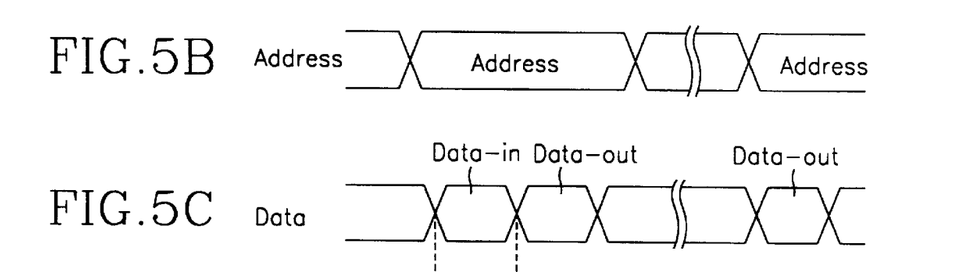
Figure 5D:
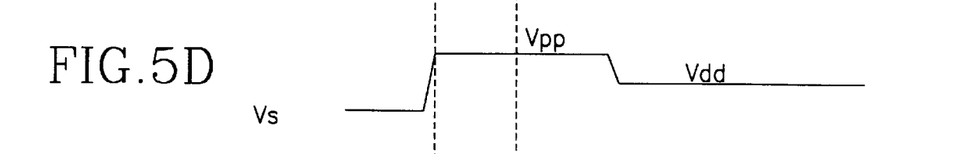
Figure 5E:
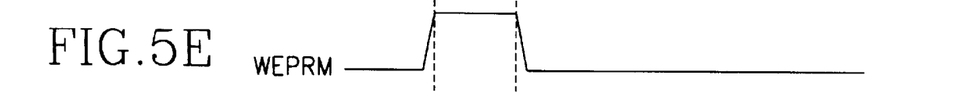
Figure 5F:
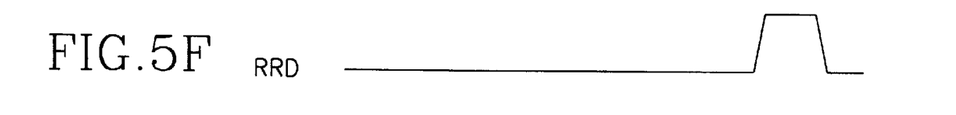
Figure 6A:
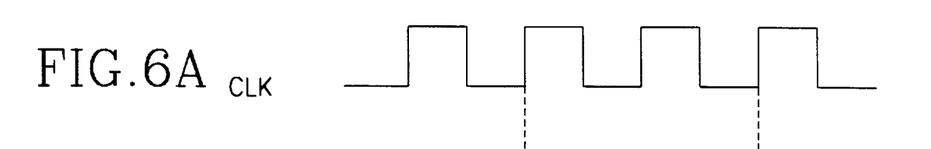
FIGS. 6A–6G are timing diagrams of the cell refresh circuit of FIG. 2 in a reprogram mode.
Figure 6B:
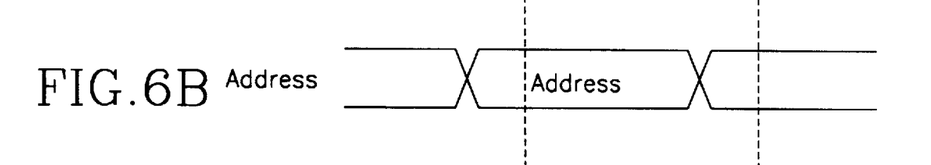
Figure 6C:
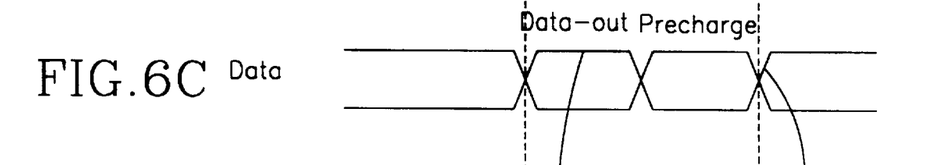
Figure 6D:
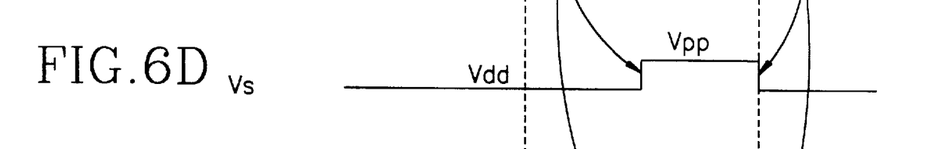
Figure 6E:
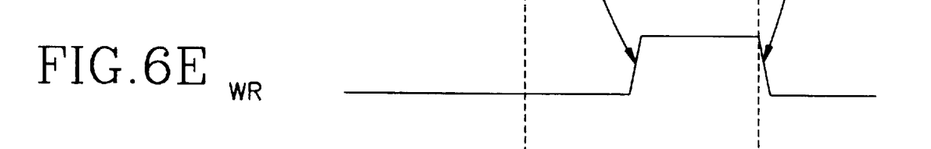
Figure 6F:
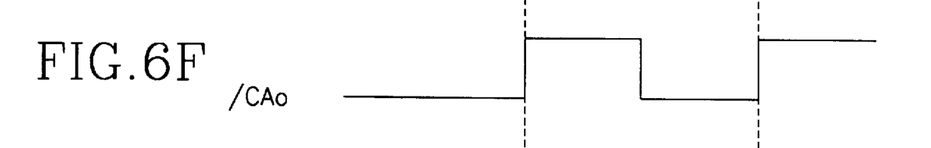
Figure 6G:
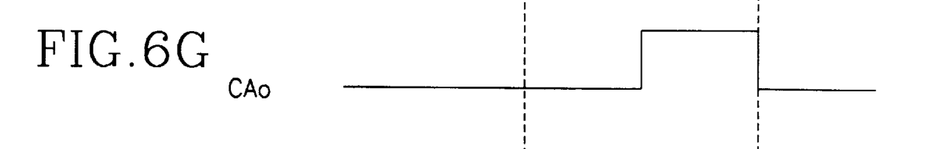

As shown in FIG. 4, the clocked inverters in the address selecting circuits (i.e., 263-1~263-n,265-1~265-n), include a pair of PMOS transistors (PM 1,PM2) and a pair of NMOS transistors (NM1,NM2) coupled in series between a power terminal and ground. An input signal (Vin) is applied to the gates of the transistors (PM1,NM2) and the control signals (CP,CN) from the address selecting units 262,264 are respectively applied to the gates of the transistors (PM2, NM1), to generate an output signal (Vout) from a connecting point between the transistors (PM2,NM1).

Operations and effects of the preferred embodiment of the present invention will now be described. In a program mode of an EPROM, when a program mode signal (WEPRM) is enabled, the power selecting controller 290 outputs the program mode signal (WEPRM) to the power switching unit 210 as the control signal (Vcon) through the OR gate (OR4). The power switching unit 210 then selects the program voltage (Vpp) to apply to the memory block 220.

Since the count enable signal (CNTEN') from the count controller 280 is low level, the address selector 260 selects externally inputted addresses (UA0, ..., UAn) as addresses (A0, ..., An) to output to the memory block 220. Thus, the control signals (CP1,CN1) from the first address selecting control unit 262 are respectively enabled low and high to operate the clocked inverters of the first address selector 263. Then, when the ROM write signal (RWR) is enabled to be high, the write controller 240 outputs the ROM write signal (RWR) to the memory block 220 as the ROM write enable signal (WROM) through the OR gate (OR1). Accordingly, the sense amplifier 230 transmits data carried on the data bus (DB) to the memory block 220 to store in a predetermined region set in accordance with the addresses (A0, . . . , An).

When a read mode is set with the program mode set and the program mode signal (WEPRM) is disabled to be low, the power switching unit 210 selects the source voltage (Vdd) to apply to the memory block 220. Since the count enable signal (CNTEN') from the count controller 280 is disabled to be low, the address selector 260 selects externally inputted addresses (UA0, . . . , UAn) as addresses (A0, . . . , An) to apply to the memory block 220. In other words, the clocked inverters of the first address selector 263 are operated similar to the write mode.

When the ROM read signal (RRD) is enabled to be high, the read controller 250 applies the ROM read signal (RRD) as the ROM read enable signal (RROM) through the OR gate (OR2) to the memory block 220. Accordingly, the sense amplifier 230 reads out data from the region of the memory block 220 set in accordance with the addresses (A0, . . . , An) to transmit to the data bus (DB). The above-described operation is performed as shown in the timing diagram of FIG. 5.

The EPROM, which has completed storing a program, can be installed in a system and operated. When installed, since the program mode signal (WEPRM) is disabled to be low, the OR gate (OR4) of the power selecting controller 290 outputs a low level of the control signal (Vcon) and the power switching unit 210 applies the external source voltage (Vdd) to the memory block 220. Here, the power supply unit 200 receives the source voltage (Vdd) to carry out a pumping operation in the charge pumping circuit 201, and applies the same level of the pumping voltage (Vpp') as the program voltage (Vpp) to the power switching unit 210 through the OR gate (OR3).

Since the user mode signal (UMB) is enabled to be high, the AND gate (AN2) of the clock signal supply unit 270 is enabled to output the clock signal (CLK) to the n-bit counter 261 of the address selector 260 as the counter clock signal (CCK). The user mode signal (UMB) is enabled to be high, but the count enable signal (CNTEN') from the AND gate (AN3) is disabled to be low when the counting time of the timer 281 does not exceed a predetermined time (CNTEN' is low). Thus, the n-bit counter 261 of the address selector 260 is not operated, and the first address selecting control unit 262 receives a low level of the count enable signal (CNTEN') to generate a low level of the control signal (CP1) through the inverters (IN1,IN2) and a high level of a control signal (CN1) through the inverter (IN3). Consequently, the clocked inverters of the first address selector 263 enter an operable state and output the externally inputted addresses (UA0, . . . , UAn) as addresses (A0, . . . , An) to the memory block 220.

When the ROM read signal (RRD) is enabled to be applied to the memory block 220 by the read controller 250 as the ROM read enable signal (RROM), the sense amplifier 230 reads out data from the region of the memory block 220 set by the addresses (A0, . . . , An) to transmit to the data bus (DB).

The timer 281 can use a real-time clock (RTC). In addition, a user can set a predetermined counting time for the time 281. Further, the user mode signal (UMB) is preferably enabled when a power plug of the system with EPROM installed is plugged into a receptacle, and disabled when the power plug is unplugged and power supply to the system is cut off. That is, the user mode signal (UMB) is enabled only in a soft power off because a refresh function must be performed when the user doesn't use the system. Soft power off is when the user doesn't use the system with the EPROM installed in the system and the power plug is not unplugged.

Then, the timer 281 of the count controller 280 counts a predetermined time to enable the count signal (CNTEN) high. Then, the AND gate (AN3) outputs the count signal (CNTEN) as a count enable signal (CNTEN') to the address selector 260 since the user mode signal (UMB) is enabled to be high.

Accordingly, since the address selector 260 receives the high level count enable signal (CNTEN') from the count controller 280, the n-bit counter 261 receives the clock signal (CCK) from the clock signal supply unit 270 to start a counting operation and generate addresses (CA0, . . . , CAn). Thus, the control signals (CP2,CN2) are respectively enabled low and high in the second address selecting control unit 264. The clocked inverters of the second address selector 265 enter an operable state to output the addresses (CA0, . . . , CAn) outputted from the n-bit counter 261 to the memory block 220 as addresses (A0, . . . , An).

When the inverted version (/CA0) of the address (CA0) of the n-bit counter 261 is enabled high, the read controller 250 applies the address (/CA0) to the memory block 220 as the ROM read enable signal (RROM) through the OR gate (OR2), which results in entering an EPROM read mode.

In the EPROM read mode, the sense amplifier 230 reads out data from the region of the memory block 220 set by the addresses (A0, . . . , An) to transmit to the data bus (DB). As a result of the reading operation when a program is stored in a predetermined region of the memory block 220, the level of the data bus (DB) becomes high. Therefore, at a point when the address (CA0) of the n-bit counter 261 is enabled to be high, the AND gate (AN1) of the write controller 240 enables the write signal (WR) to be high, and the OR gate (OR1) applies the write signal (WR) to the memory block 220 as the ROM write enable signal (WROM).

Here, since the power selecting controller 290 outputs the write signal (WR) from the write controller 240 as the power selecting control signal (Vcon), the power switching unit 210 selects the output voltage from the charge pumping circuit 201 to apply to the memory block 220. Accordingly, since the EPROM write mode is set, the sense amplifier 230 reprograms the data on the data bus (DB) in a corresponding region of the memory block 220.

As a result of the EPROM reading operation when data is not written, the data bus (DB) becomes low level and the write signal (WR) from the AND gate (AN1) of the write controller 240 becomes low level. Accordingly, the ROM write enable signal (WROM) from the OR gate (OR1) is maintained low level and the power selecting control signal (Vcon) from the power selecting controller 290 is also maintained to be low level. As a result, the power switching unit 210 continues the supply of the source voltage (Vdd) to the memory block 220. Consequently, the write operation of the data with respect to the memory block 220 is not performed.

That is, at a point when the address (CA0) of the address selector 260 is enabled (e.g., whenever the timer 281 enables the count signal (CNTEN) every predetermined time in the normal operation mode), a read mode is set to read the data of the memory block 220, and only when the data is stored, a write mode is set to perform a refresh operation. Therefore, a refresh is performed only on the cells programmed in the program mode.

Then, when the addresses (A0, . . . , An) from the address selector 260 become all high level, the AND gate 266 makes the reset signal (TRST) high level to clear the timer 281 of the count controller 280 and disable the count signal (CNTEN) to be low level. The reset signal (TRST) is count-reset after the addresses (CA0, . . . , CAn) reach a 'FFFF' value and is also reset after the addresses (CA0, . . . , CAn) reach 'D0000. . . FFFF' which belongs to the address in a specific section. Accordingly, the n-bit counter 261 can perform a counting operation only for a specific region. As a result, the reprogram mode with respect to the EPROM is changed to a normal operation mode.

The operation of the above-described reprogram mode is performed in the same way as shown in the timing diagram of FIG. 6. The timer 281 stops the counting operation until the user mode signal (UMB) is enabled if the user mode signal (UMB) is disabled and the clock signal (CCK) is not outputted from the clock signal supply unit 270, even when the count enable signal (CNTEN') is enabled to be high.

As described above, the preferred embodiment of the present invention can maintain the characteristics of data by periodically reprogramming to compensate for a charge loss with respect to the programmed EPROM. Thus, the preferred embodiment can cause programmed EPROM cells to be refreshed to ensure the reliability of the system.

Based on the characteristic of maintaining data in the EPROM, (e.g., if the characteristic of data loss over time is known) a reprogram cycle can be arbitrarily set. Therefore, the characteristics of the data can be ensured irrespective of the quality of the characteristics of maintaining data of the EPROM cell.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A cell refresh circuit for a memory device, comprising:
   a power input circuit that applies a program voltage in a program mode and applies one of a source voltage and pumping voltage based on a reprogram signal in an operation mode;
   a controller circuit for respectively outputting a read/write enable signal;
   an address selector circuit that selects one of a first address and a second address and outputting the selected address;
   clock signal supply circuit that outputs the clock signal to the address selector circuit based on a user mode signal; and
   timing circuit that outputs the reprogram signal to the address selector circuit based on the user mode signal and an elapsed prescribed time, wherein the power input circuit comprises,
      a power selecting controller that outputs one of a program mode signal and a write signal as a power selecting control signal,
      a power supply unit that outputs the program voltage, the source voltage and the pumping voltage as an output voltage, and
      a power switching unit that selects the output voltage from the power supply unit based on the power selecting control signal.

2. The circuit of claim 1, wherein the power supply unit comprises:
   a charge pumping circuit that generates the pumping voltage by pumping the source voltage; and
   a selecting circuit that selects the program voltage in the program mode and an output voltage from the charge pumping circuit in the operation mode to output to the power switching unit.

3. The circuit of claim 2, wherein the power selecting controller and the selecting circuit comprise a logic-gate.

4. The circuit of claim 1, wherein the controller circuit comprises:
   a write controller that generates a write signal based on the reprogram signal and a ROM write signal in the program mode as the write enable signal; and
   a read controller that outputs a ROM read signal or an inverted address from the address selector circuit as the read enable signal.

5. The circuit of claim 1, wherein the clock signal supply circuit comprises a logic circuit that applies the clock signal as a counter clock signal to the address selector circuit when the user mode signal is enabled.

6. The circuit of claim 1, wherein the timing circuit comprises:
   a timer that generates a counting signal by counting the prescribed time, wherein the timer is cleared by a reset signal from the address selector circuit; and
   a logic circuit that logically processes the user mode signal and an output signal from the timer to output a count enable signal to the address selector circuit.

7. The circuit of claim 6, wherein the timer sets the prescribed counting time.

8. The circuit of claim 1, wherein the address selector circuit comprises:
   an n-bit counter that outputs the second address by counting the clock signal when a count enable signal from the timing circuit is enabled;
   a first address selecting unit that selects the second address to output;
   a second address selecting unit that selects the first address to output;
   first and second address selecting control units that respectively control operations of the first and second address selecting units based on the count enable signal; and
   a logic circuit that logically processes the selected address to output a reset signal to the timing circuit.

9. The circuit of claim 8, wherein each of the first address selecting unit and the second address selecting unit comprises a plurality of address selecting circuits coupled in parallel for respectively selecting portions of the first and second address to transmit, wherein each of the plurality of address selecting circuits comprises:
   an inverter for inverting a corresponding portion of the selected address; and
   a clocked inverter for inverting an output signal from the inverter to transmit based on control signals respectively output from a corresponding one of the first address selecting control unit and the second address selecting control unit.

10. The circuit of claim 9, wherein each of the clocked inverters comprises:

first through fourth transistors coupled in series between first and second reference potentials, wherein an input signal is applied to control electrodes of the first transistor and the fourth transistor, wherein two control signals from the corresponding one of the address selecting control units are respectively applied to control electrodes of the second and third transistors, and wherein an output signal is generated from a coupling point between the second transistor and the third transistor.

11. The circuit of claim 10, wherein each of the first and second address selecting control unit comprises:

first and second inverters that sequentially invert the output signal from the timing circuit and output a first control signal; and a third inverter that inverts the output signal from the timing circuit to output a second control signal.

12. A cell refresh circuit for a memory device, comprising:

a power input circuit that applies a program voltage in a program mode and applies one of a source voltage and a pumping voltage based on a reprogram signal in an operation mode;

a controller circuit for respectively outputting a read/write enable signal;

an address selector circuit that selects one of a first address and a second address and outputting the selected address;

clock signal supply circuit that outputs the clock signal to the address selector circuit based on a user mode signal; and timing circuit that outputs the reprogram signal to the address selector circuit based on the user mode signal and an elapsed prescribed time, wherein the address selector circuit comprises, an n-bit counter that outputs the second address when a count enable signal from the timing circuit is enabled, a first address selecting unit that selects the second address to output, a second address selecting unit that selects the first address to output, first and second address selecting control units that respectively control operations of the first and second address selecting units based on the count enable signal, and a logic circuit that logically processes the selected address to output a reset signal to the timing circuit.

13. The circuit of claim 12, wherein each of the first address selecting unit and the second address selecting unit comprises a plurality of address selecting circuits coupled in parallel for respectively selecting portions of the first and second address to transmit, wherein each of the plurality of address selecting circuits comprises:

an inverter for inverting a corresponding portion of the selected address; and a clocked inverter for inverting an output signal from the inverter to transmit based on control signals respectively output from a corresponding one of the first address selecting control unit and the second address selecting control unit, wherein each of the clocked inverters comprises, first through fourth transistors coupled in series between first and second reference potentials, wherein an input signal is applied to control electrodes of the first transistor and the fourth transistor, wherein two control signals from the corresponding one of the address selecting control units are respectively applied to control electrodes of the second and third transistors, and wherein an output signal is generated from a coupling point between the second transistor and the third transistor.

14. The circuit of claim 12, wherein each of the first and second address selecting control unit comprises:

first and second inverters that sequentially invert the output signal from the timing circuit and output a first control signal; and a third inverter that inverts the output signal from the timing circuit to output a second control signal.

15. The circuit of claim 12, wherein the power input circuit comprises:

a power selecting controller that outputs one of a program mode signal and a write signal as a power selecting control signal;

a power supply unit that outputs the program voltage, the source voltage and the pumping voltage as an output voltage; and a power switching unit that selects the output voltage from the power supply based on the power selecting control signal, and wherein the power supply unit comprises, a charge pumping circuit that generates the pumping voltage by pumping the source voltage, and a selecting circuit that selects the program voltage in the program mode and an output voltage from the charge pumping circuit in the operation mode to output to the power switching unit, and wherein the power selecting controller and the selecting circuit comprise a logic-gate.

16. A cell refresh circuit for a memory device, comprising:

a power input circuit that applies a program voltage in a program mode and applies one of a source voltage and a pumping voltage based on a reprogram signal in an operation mode, wherein the pumping voltage is equal to the source voltage increased by a prescribed amount;

a controller circuit for respectively outputting a read/write enable signal;

an address selector circuit that selects one of a first address and a second address and outputs the selected address;

a clock signal supply circuit that outputs the clock signal to the address selector circuit based on a user mode signal; and a timing circuit that outputs the reprogram signal to the address selector circuit based on the user mode signal and an elapsed prescribed time.

17. The circuit of claim 16, wherein the power input circuit further comprises a power supply unit that outputs the program voltage, the source voltage and the pumping voltage as an output voltage, wherein the power supply unit has a pumping circuit that receives the source voltage and outputs the pumping voltage increased by the prescribed amount based on the source voltage.

18. The circuit of claim 17, wherein the power input circuit comprises:

a power selecting controller that outputs one of a program mode signal and a write signal as a power selecting control signal; and a power switching unit that selects the output voltage from the power supply unit based on the power selecting control signal, and wherein the pumping circuit increases the received source voltage to output the pumping voltage.

19. The circuit of claim 18, wherein the power supply unit comprises a selecting circuit that selects the program voltage in the program mode and an output voltage from the pumping circuit in the operation mode to output to the power switching unit, and wherein the power selecting controller and the selecting circuit comprise a logic-gate.

20. The circuit of claim 18 wherein the address selector circuit comprises:

an n-bit counter that outputs the second address when a count enable signal from the timing circuit is enabled;

a first address selecting unit that selects the second address to output;

a second address selecting unit that selects the first address to output;

an address selecting control unit that respectively controls operations of the first and second address selecting units based on the count enable signal; and a logic circuit that logically processes the selected address to output a reset signal to the timing circuit.

\* \* \* \* \*